United States Patent
Campbell et al.

(10) Patent No.: US 9,313,920 B2
(45) Date of Patent: Apr. 12, 2016

(54) DIRECT COOLANT CONTACT VAPOR CONDENSING

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Dustin W. Demetriou, Poughkeepsie, NY (US); Michael J. Ellsworth, Jr., Poughkeepsie, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 299 days.

(21) Appl. No.: 14/058,546

(22) Filed: Oct. 21, 2013

(65) Prior Publication Data

US 2015/0109730 A1 Apr. 23, 2015

(51) Int. Cl.
| | |
|---|---|
| *H02B 1/00* | (2006.01) |
| *H02B 1/56* | (2006.01) |
| *H05K 7/20* | (2006.01) |
| *G06F 1/20* | (2006.01) |
| *H05K 5/00* | (2006.01) |
| *F28D 15/00* | (2006.01) |
| *F28F 7/00* | (2006.01) |
| *F28B 3/04* | (2006.01) |
| *F28D 15/02* | (2006.01) |
| *F25B 23/00* | (2006.01) |

(52) U.S. Cl.
CPC *H05K 7/203* (2013.01); *F28B 3/04* (2013.01); *F28D 15/0266* (2013.01); *H05K 7/20809* (2013.01); *F25B 23/006* (2013.01); *Y10T 29/4935* (2015.01)

(58) Field of Classification Search
CPC ... H05K 7/203; H05K 7/208; H05K 7/20318; H05K 7/20327; H05K 7/20345; F25B 39/04; F25B 39/00; F25B 39/02; B23P 15/26; G06F 1/20; G06F 1/203; G06F 1/206
USPC .......... 361/679.53, 676–678, 679.46–679.54, 361/688–723, 831; 165/104.27, 80.4, 165/104.19, 102.26, 104.33; 29/890.03; 62/259.2, 475; 257/714, 715
See application file for complete search history.

(56) References Cited

U.S. PATENT DOCUMENTS

| | | | | |
|---|---|---|---|---|
| 3,406,244 A | * | 10/1968 | Oktay | F28C 3/04 165/104.13 |
| 7,511,957 B2 | | 3/2009 | Campbell et al. | |

(Continued)

OTHER PUBLICATIONS

Patnaik, Pallavi "A Hydrophilic & Oleophobic Filter", WordPress, sciencenews.org, http://www.mytechskool.com/2012/10/a-hydrophilic-oleophobic-filter/, posted Oct. 5, 2012 (3 pages).

*Primary Examiner* — Courtney Smith
*Assistant Examiner* — Zhengfu Feng
(74) *Attorney, Agent, or Firm* — Steven Chiu, Esq.; Kevin P. Radigan, Esq.; Heslin Rothenberg Farley & Mesiti P.C.

(57) ABSTRACT

Cooling apparatuses and methods are provided facilitating transfer of heat from a working fluid to a coolant. The cooling apparatus includes a vapor condenser which includes a condenser housing with a condensing chamber accommodating the working fluid and coolant, which are in direct contact within the condensing chamber and are immiscible fluids. The condensing chamber includes a working fluid vapor layer and a working fluid liquid layer; and a working fluid vapor inlet facilitates flow of fluid vapor into the condensing chamber, and a working fluid vapor outlet facilitates egress of working fluid liquid from the condensing chamber. A coolant inlet structure facilitates ingress of coolant into the working fluid vapor layer of the condensing chamber in direct contact with the working fluid vapor to facilitate condensing the vapor into working fluid liquid, and the coolant outlet structure facilitates subsequent egress of coolant from the condensing chamber.

17 Claims, 15 Drawing Sheets

(56) References Cited

U.S. PATENT DOCUMENTS

| | | |
|---|---|---|
| 7,787,248 B2 | 8/2010 | Campbell et al. |
| 7,944,694 B2 | 5/2011 | Campbell et al. |
| 7,948,757 B2 | 5/2011 | Campbell et al. |
| 8,179,677 B2 | 5/2012 | Campbell et al. |
| 8,184,436 B2 | 5/2012 | Campbell et al. |
| 8,194,406 B2 * | 6/2012 | Campbell .......... H05K 7/20827 165/104.33 |
| 9,113,581 B2 * | 8/2015 | Campbell ............ H05K 7/2029 |
| 2011/0317367 A1 * | 12/2011 | Campbell .......... H05K 7/20809 361/700 |
| 2012/0000853 A1 | 1/2012 | Tuteja et al. |

* cited by examiner

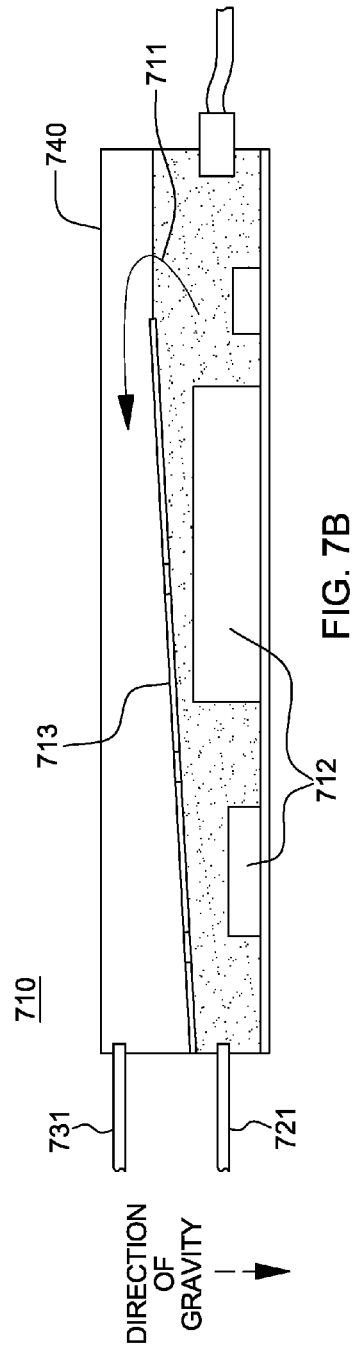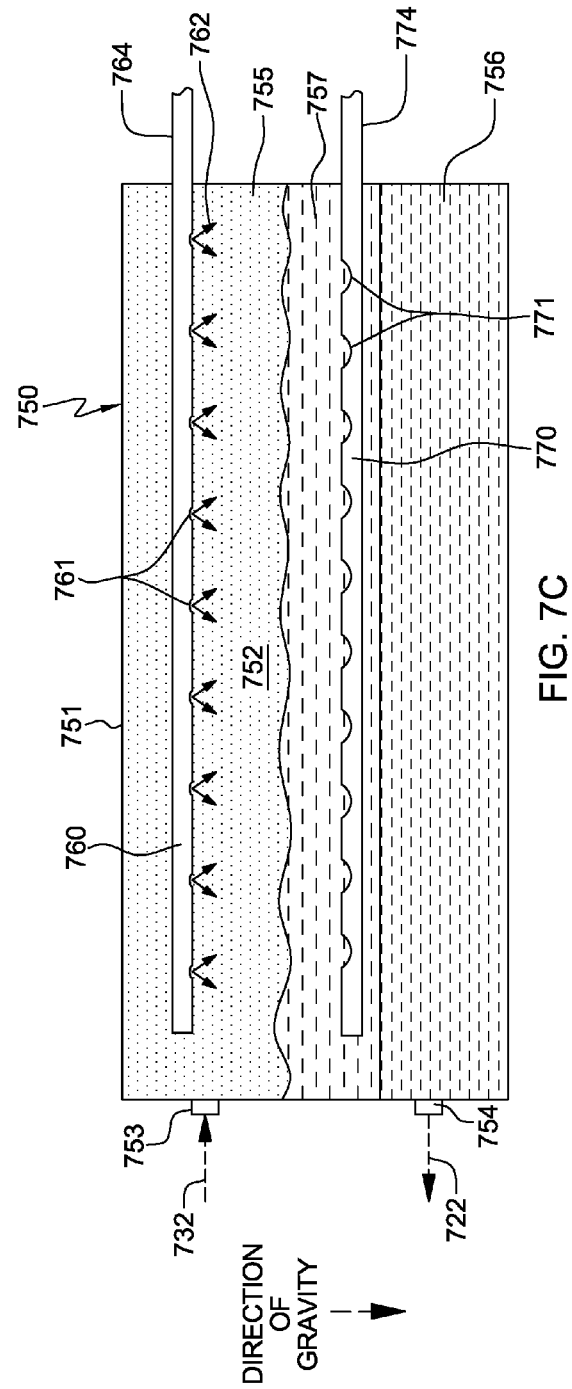

DIRECT COOLANT CONTACT VAPOR CONDENSING

BACKGROUND

The power dissipation of integrated circuit chips, and the modules containing the chips, continues to increase in order to achieve increases in processor performance. This trend poses cooling challenges at the module and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

The shortcomings of the prior art are overcome and additional advantages are provided through the provision of a cooling apparatus comprising, for instance, a vapor condenser which includes a condenser housing, a working fluid vapor inlet and working fluid liquid outlet, and a coolant inlet structure and a coolant outlet structure. The condenser housing includes a condensing chamber which accommodates a working fluid and a coolant in direct contact. The working fluid and the coolant are immiscible fluids, and the condensing chamber includes a working fluid vapor layer and a working fluid liquid layer. The working fluid vapor inlet facilitates flow of working fluid vapor into the condensing chamber, and the working fluid liquid outlet facilitates egress of working fluid liquid from the condensing chamber. The coolant inlet structure facilitates ingress of the coolant into the working fluid vapor layer of the condensing chamber in direct contact with the working fluid vapor to facilitate condensing of the working fluid vapor into the working fluid liquid and thereby transfer of heat from the working fluid vapor to the coolant, and the coolant outlet structure facilitates subsequent egress of coolant from the condensing chamber of the housing.

In another aspect, a coolant-cooled electronic system is provided which includes, for instance, an electronic system and a cooling apparatus comprising a vapor condenser. The electronic system is cooled, at least in part, by a working fluid boiling within an electronic system housing, and the vapor condenser is coupled in fluid communication with the electronic system housing to facilitate transfer of the working fluid between the electronic system housing and the vapor condenser. The vapor condenser includes a condenser housing, a working fluid vapor inlet and working fluid liquid outlet, and a coolant inlet structure and a coolant outlet structure. The condenser housing includes a condensing chamber which accommodates the working fluid and a coolant in direct contact. The working fluid and the coolant are immiscible fluids, and the condensing chamber includes a working fluid vapor layer and a working fluid liquid layer. The working fluid vapor inlet facilitates flow of working fluid vapor into the condensing chamber, and the working fluid liquid outlet facilitates egress of working fluid liquid from the condensing chamber. The coolant inlet structure facilitates ingress of the coolant into the working fluid vapor layer of the condensing chamber in direct contact with the working fluid vapor to facilitate condensing of the working fluid vapor into the working fluid liquid and thereby transfer of heat from the working fluid vapor to the coolant, and the coolant outlet structure facilitates subsequent egress of coolant from the condensing chamber of the housing.

In a further aspect, a method is provided which includes: providing a vapor condenser, wherein providing the vapor condenser includes: providing a condenser housing comprising a condensing chamber accommodating a working fluid and a coolant, the working fluid and the coolant being in direct contact within the condensing chamber and being immiscible fluids, and the condensing chamber comprising a working fluid vapor layer and a working fluid liquid layer; providing a working fluid vapor inlet and a working fluid liquid outlet, the working fluid vapor inlet facilitating flow of working fluid vapor into the condensing chamber, and the working fluid liquid outlet facilitating egress of working fluid liquid from the condensing chamber; and providing a coolant inlet structure and a coolant outlet structure, the coolant inlet structure facilitating ingress of coolant into the working fluid vapor layer of the condensing chamber in direct contact with the working fluid vapor to facilitate condensing of the working fluid vapor into the working fluid liquid and thereby transfer of heat from the working fluid vapor to the coolant, and the coolant outlet structure facilitating subsequent egress of the coolant from the condensing chamber of the condenser housing.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7B is a cross-sectional elevational view of one immersion-cooled electronic system of the coolant-cooled electronics rack of FIG. 7A, in accordance with one or more aspects of the present invention;

FIG. 7C is a cross-sectional elevational view of one embodiment of a vapor condenser for, for instance, the coolant-cooled electronics rack of FIG. 7A, in accordance with one or more aspects of the present invention;

DETAILED DESCRIPTION

Figure 1:
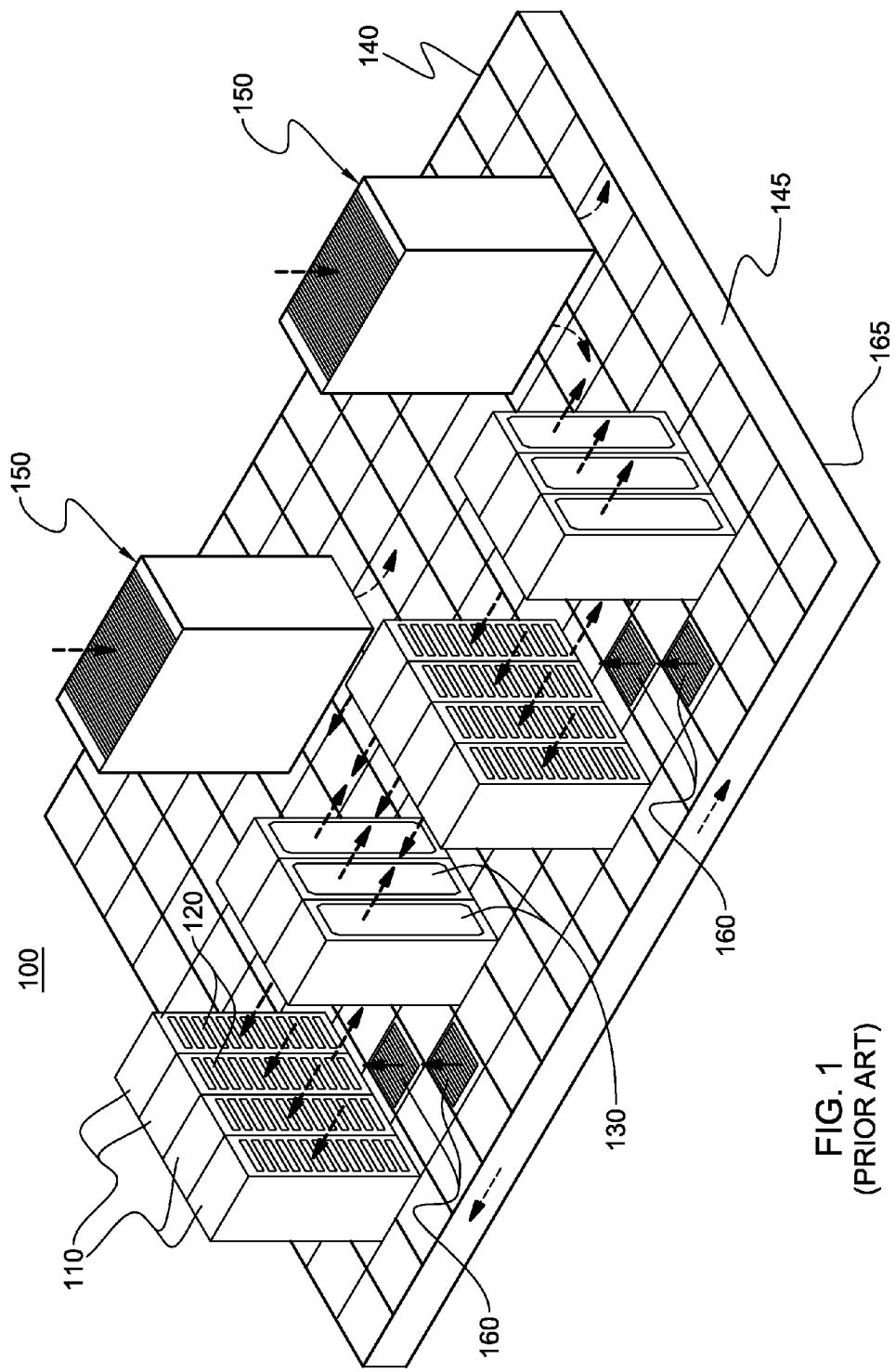
FIG. 1 depicts one embodiment of a conventional raised floor layout of an air-cooled computer installation.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" refers to any heat generating electronic component of, for example, a computer system or other electronic system requiring cooling. By way of example, an electronic component may comprise one or more integrated circuit dies and/or other electronic devices to be cooled, including one or more processor dies, memory dies or memory support dies. As a further example, an electronic component may comprise one or more bare dies or one or more packaged dies disposed on a common carrier. Further, unless otherwise specified herein, the terms "liquid-cooled cold plate", "liquid-cooled base plate", or "liquid-cooled structure" each refer to any conventional thermally conductive structure having a plurality of channels or passageways formed therein for flowing of liquid-coolant therethrough.

As used herein, a "heat exchanger" may comprise, for example, one or two or more coolant flow paths, formed of thermally conductive tubing (such as copper or other tubing) in thermal or mechanical contact with each other, or in thermal or mechanical contact with a plurality of thermally conductive fins in the case of a condensing heat exchanger. Size, configuration and construction of the heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings, which are not drawn to scale for ease of understanding of the various aspects of the present invention, wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
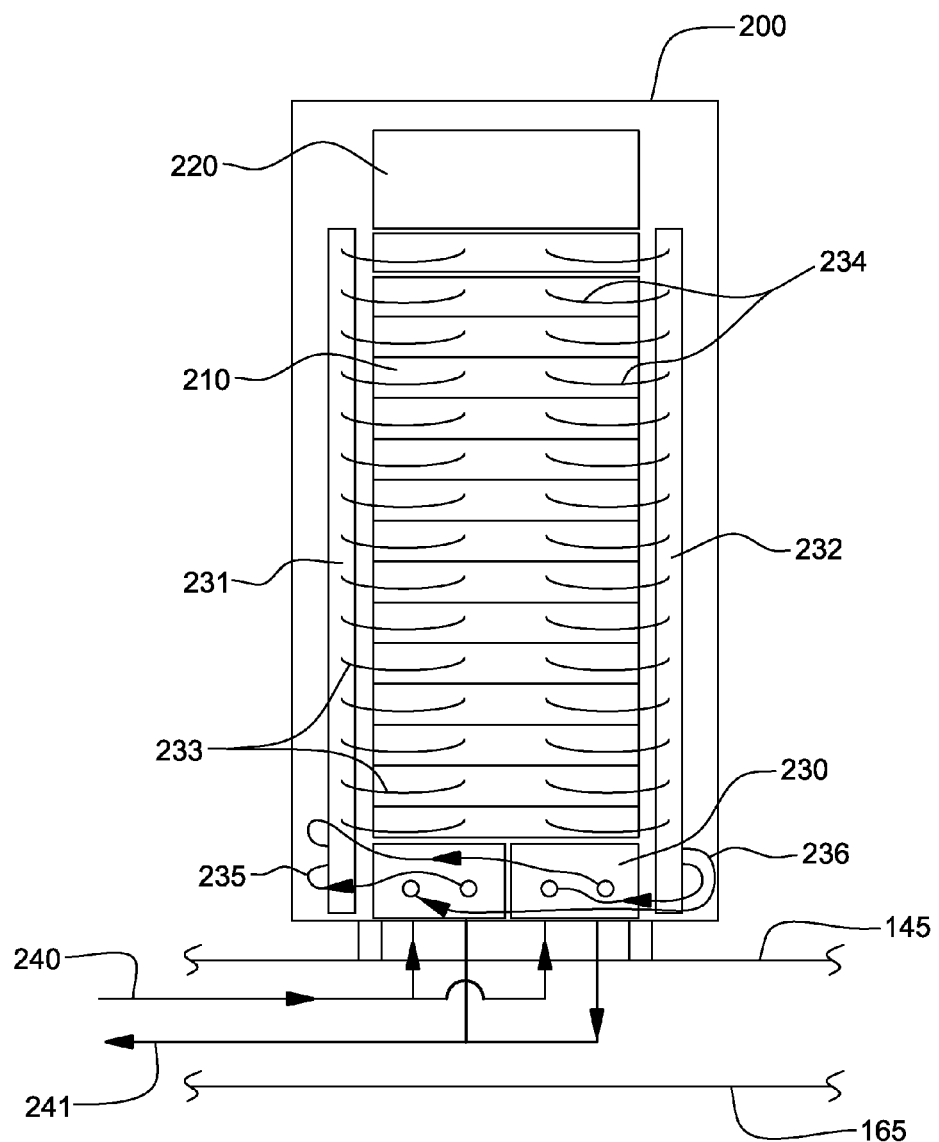
FIG. 2 is a front elevational view of one embodiment of a liquid-cooled electronics rack comprising multiple electronic systems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus depicted includes a system coolant supply manifold 231, a system coolant return manifold 232, and manifold-to-node fluid connect hoses 233 coupling system coolant supply manifold 231 to electronic systems 210 (for example, to cold plates or liquid-cooled vapor condensers (see FIGS. 6A-6B) disposed within the systems) and node-to-manifold fluid connect hoses 234 coupling the individual electronic systems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems 210 is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
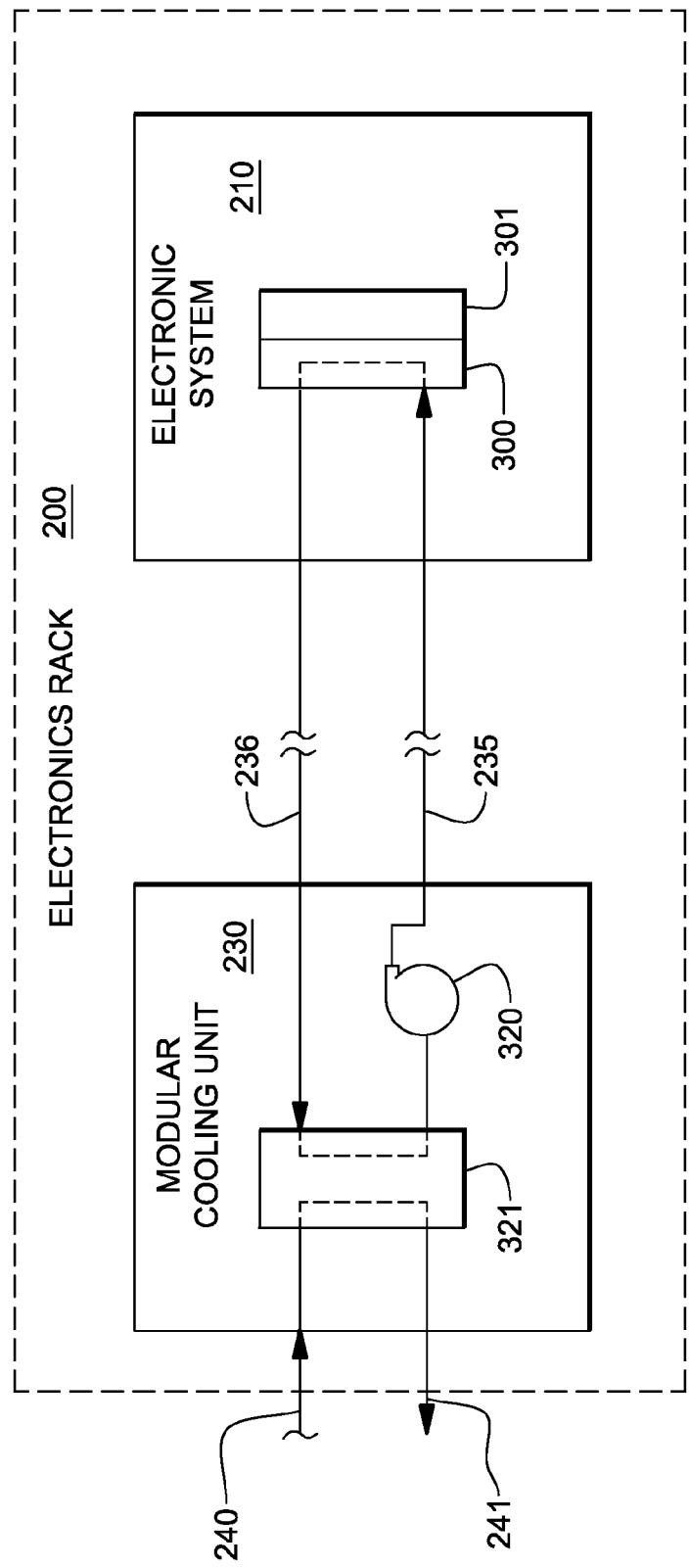
FIG. 3 is a schematic of an electronic system of an electronics rack and one approach to liquid-cooling of an electronic component with the electronic system, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 240, 241, to which heat is ultimately transferred.

Figure 4:
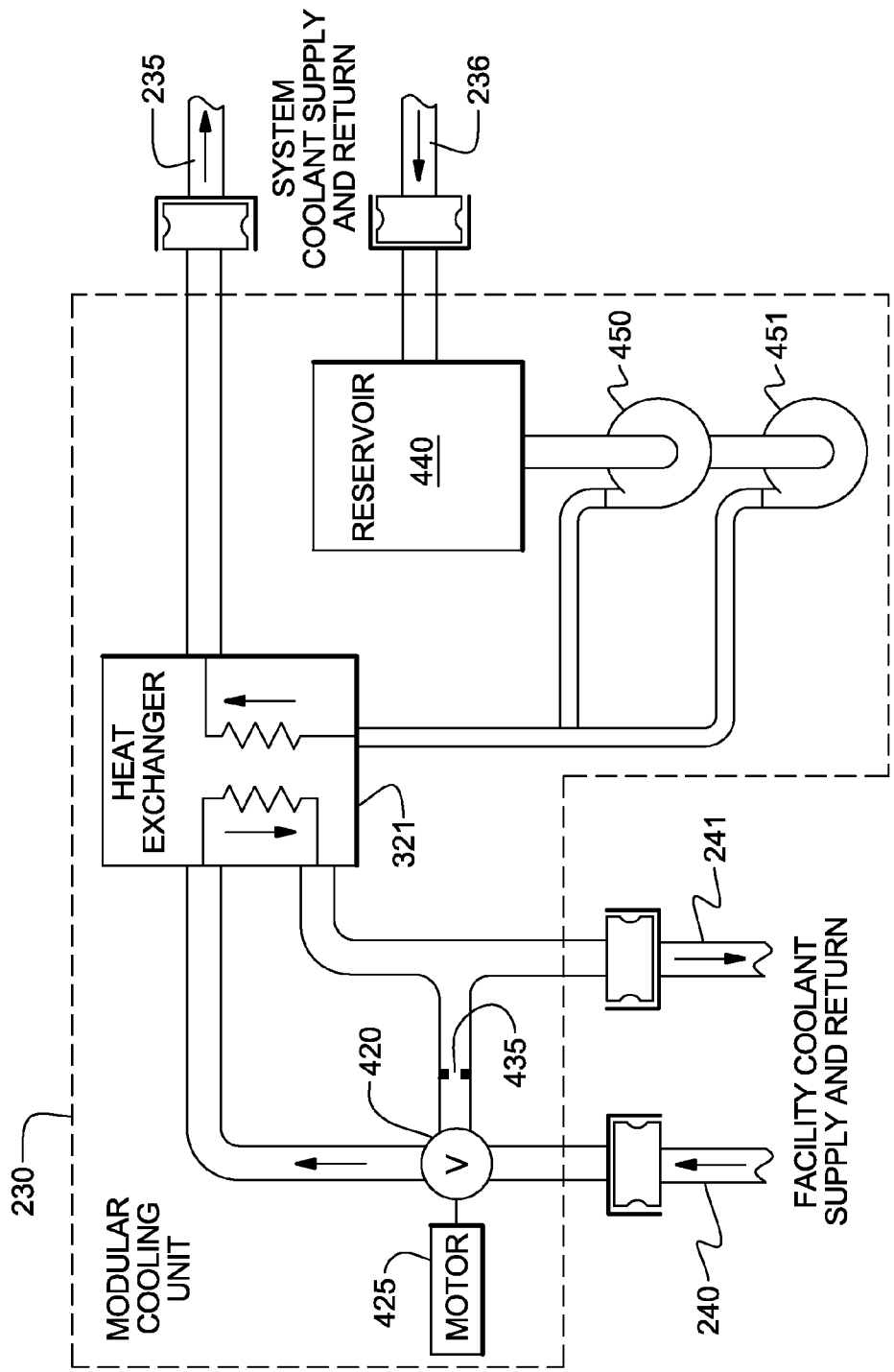
FIG. 4 is a schematic of one embodiment of a modular cooling unit for a liquid-cooled electronics rack such as illustrated in FIG. 2, in accordance with one or more aspects of the present invention.

FIG. 4 depicts one embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
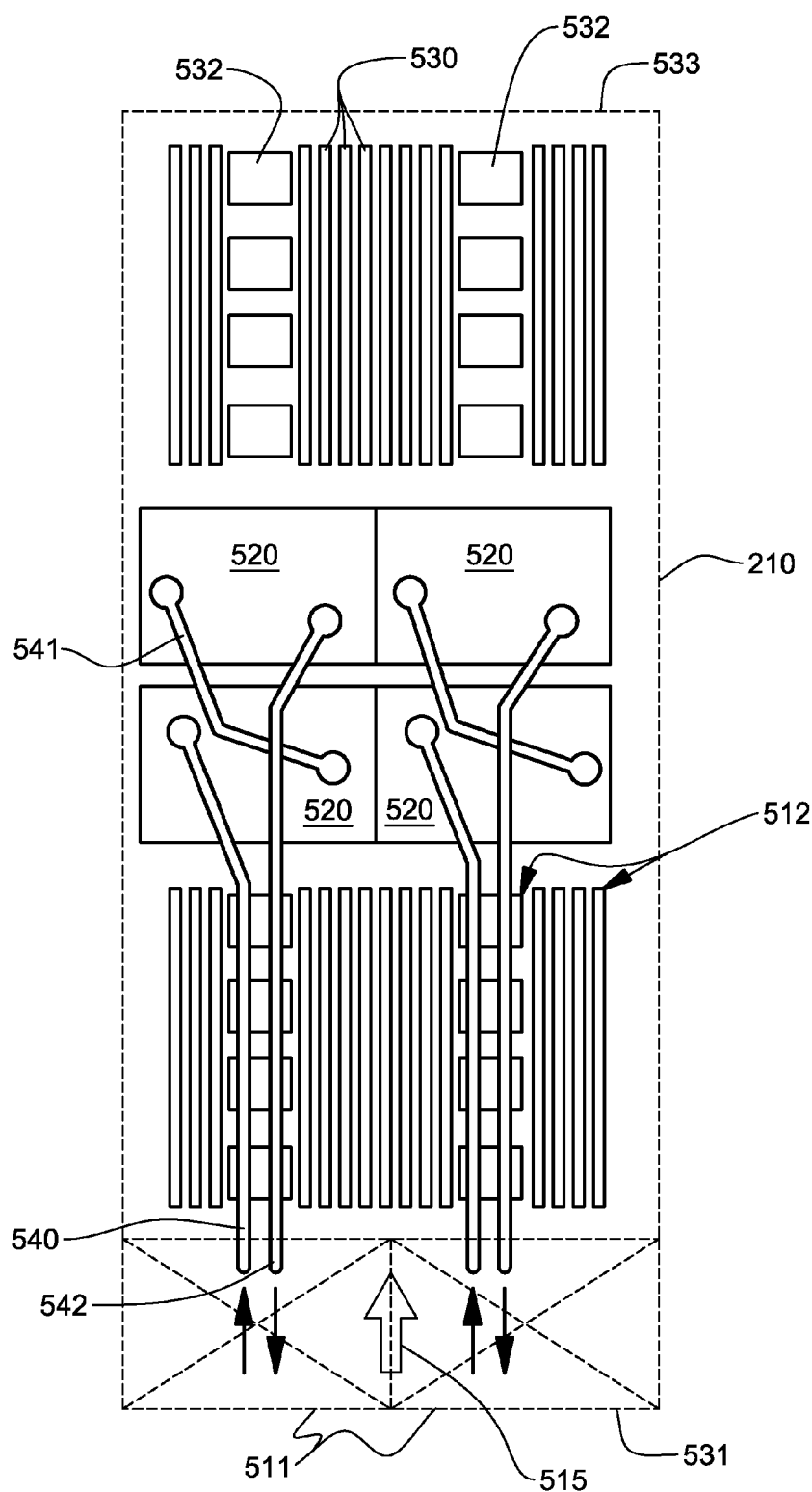
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics system.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic system using liquid-cooled structures alone, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, the components to be cooled are immersed in a dielectric fluid that dissipates heat through boiling. The vapor is then condensed by a secondary, rack-level system (or facility) fluid, using (in one embodiment) node or module-level, finned condensers, as explained below.

Direct immersion-cooling of electronic components of an electronic system of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 3 & 5, which require shipping dry and the use of a fill and drain protocol to insure against freeze damage during transport. Also, the use of liquid immersion-cooling may, in certain cases, allow for greater compaction of electronic components at the electronic system level and/or electronics rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic systems of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a working fluid with a solubility in the condensing coolant of less than 0.1% by weight and a specific gravity greater than the condensing coolant may be employed.

Figure 6A:
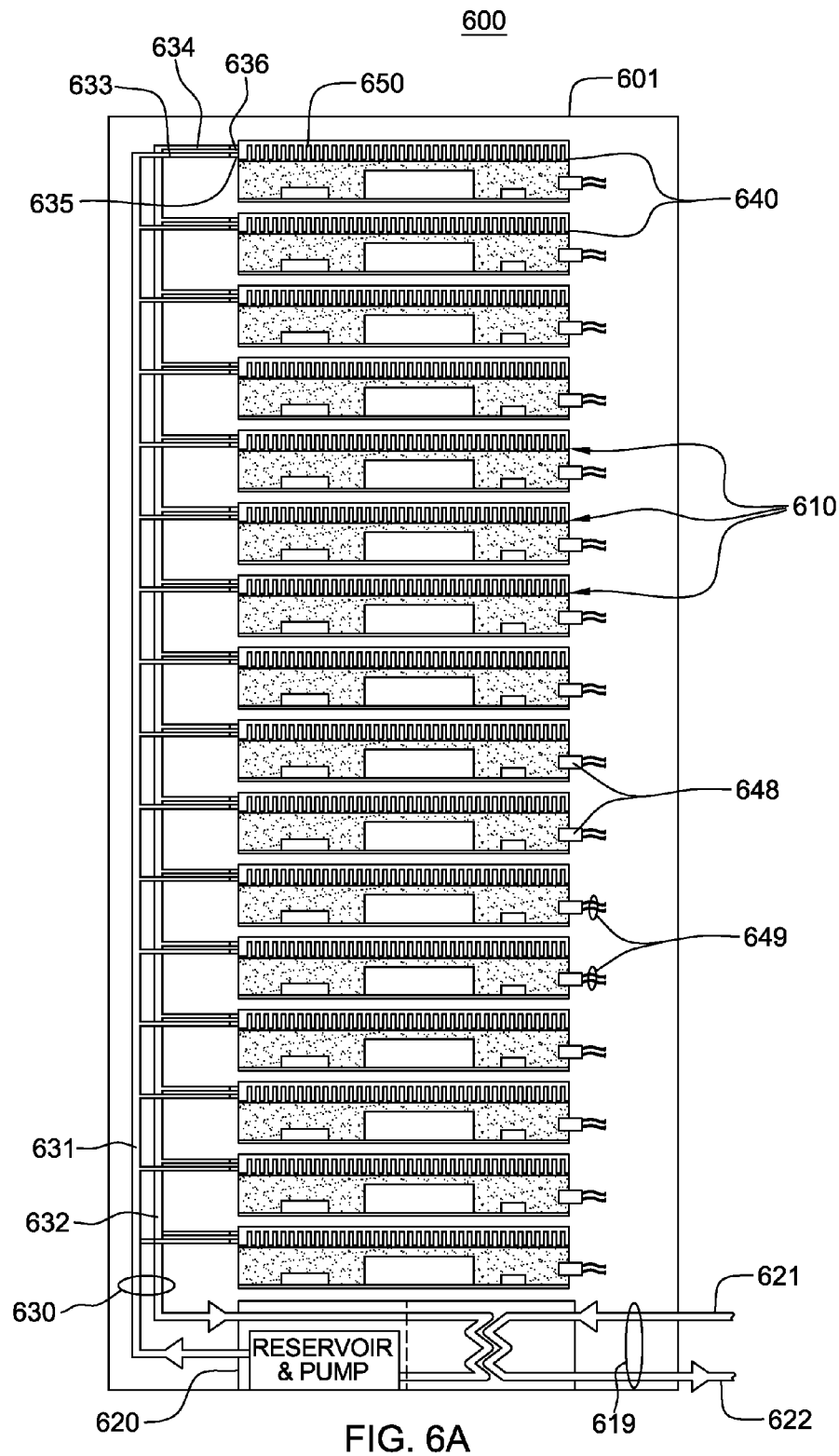
FIG. 6A is an elevational view of an alternate embodiment of a liquid-cooled electronics rack with immersion-cooling of electronic systems thereof, in accordance with one or more aspects of the present invention.

FIG. 6A is a schematic of one embodiment of a liquid-cooled electronics rack, generally denoted 600, employing immersion-cooling of electronic systems, in accordance with an aspect of the present invention. As shown, liquid-cooled electronics rack 600 includes an electronics rack 601 containing a plurality of electronic systems 610 disposed, in the illustrated embodiment, horizontally so as to be stacked within the rack. By way of example, each electronic system 610 may be a server unit of a rack-mounted plurality of server units. In addition, each electronic system includes multiple electronic components to be cooled, which in one embodiment, comprise multiple different types of electronic components having different heights and/or shapes within the electronic system.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic systems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic system 610 via the respective liquid-cooled vapor condenser 650 is transferred from the system coolant via the coolant return manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic systems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic systems) to the manifolds via the flexible hoses 633, 634. Respective quick connect couplings may be employed to couple the flexible hoses to the coolant inlets and coolant outlets of the sealed housings to allow for, for example, removal of a housing and electronic system from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic system disposed within the sealed housing when the electronic system is operatively positioned within the sealed housing and the sealed housing is operatively positioned within the electronics rack.

Figure 6B:
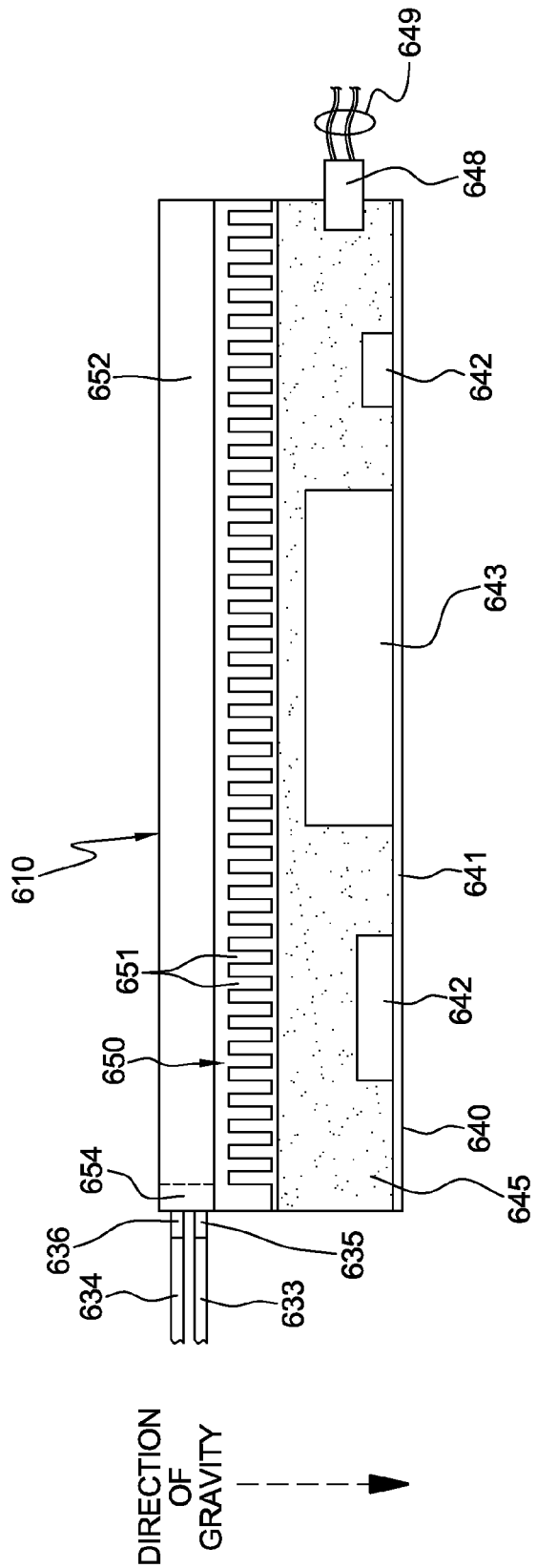
FIG. 6B is a cross-sectional elevational view of one immersion-cooled electronic system of the liquid-cooled electronics rack of FIG. 6A, in accordance with one or more aspects of the present invention.

As illustrated in FIG. 6B, electronic system 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic system with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651 extending therefrom in the upper portion of the sealed compartment. A plenum structure 654 comprises part of liquid-cooled base plate 652, and facilitates passage of system coolant through one or more channels in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cooler condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

As a variation on the immersion-cooling approach of FIGS. 6A & 6B, one or more components of an electronic system or subsystem may be at least partially immersion-cooled using pumped dielectric coolant. In one embodiment, a housing or enclosure may be provided at least partially surrounding and forming a compartment about the one or more electronic components to be immersion-cooled. Coupled to the housing is a coolant loop which provides pumped dielectric coolant flow through the compartment of the housing. This pumped dielectric fluid at least partially immersion-cools the one or more components within the housing, and in one embodiment, heat transfer is facilitated by, at least in part, flow boiling of the pumped dielectric coolant. In such an implementation, dielectric coolant vapor exits the compartment, or a mixture of dielectric coolant vapor and liquid exits the compartment. When utilizing boiling of dielectric fluid to facilitate electronic component cooling, a condenser may be employed, located within the housing, or remote from the housing.

Figure 7A:
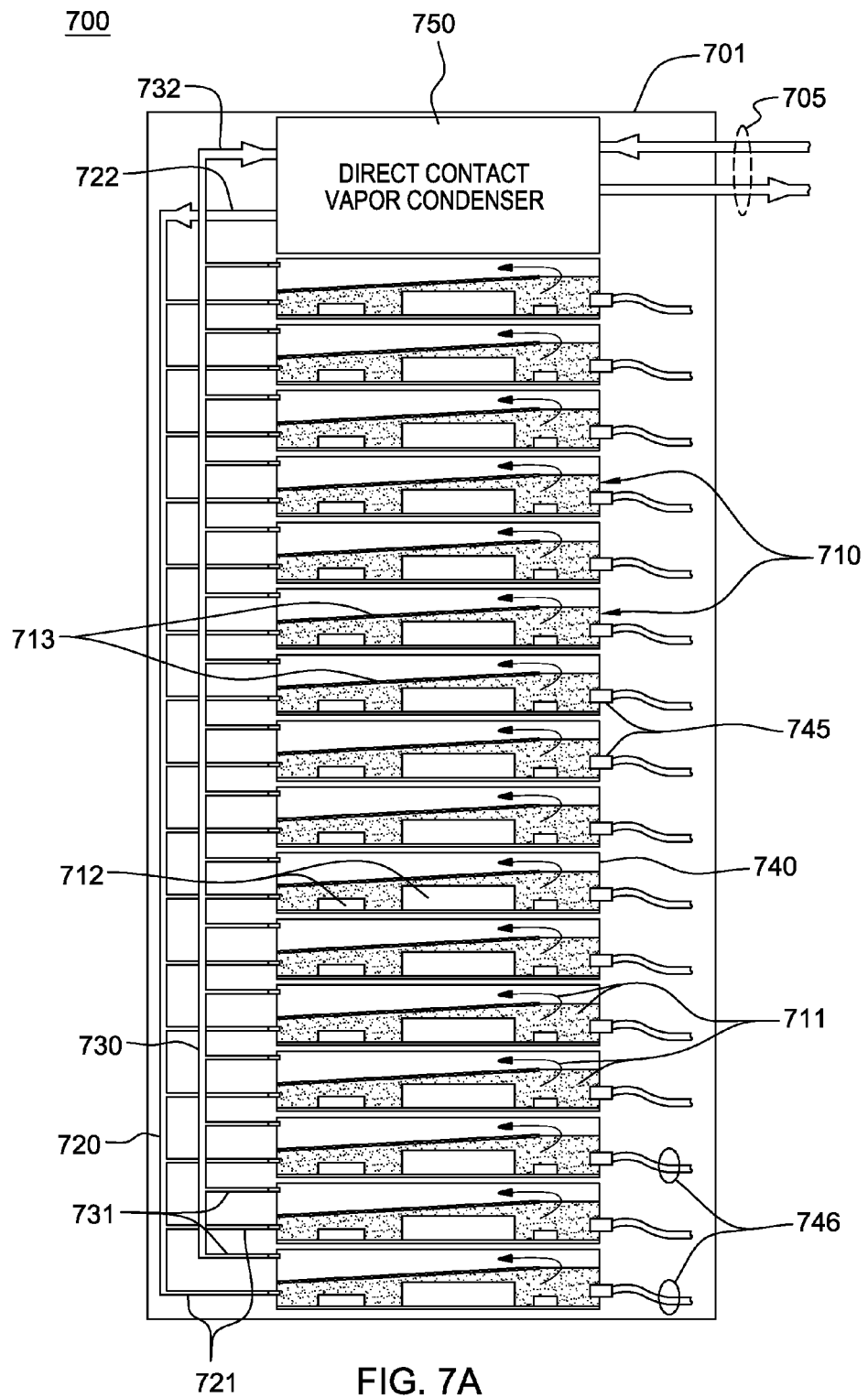
FIG. 7A is an elevational view of another embodiment of an coolant-cooled electronics rack comprising a cooling apparatus and multiple electronic systems or subsystems at least partially immersion-cooled by a working fluid of the cooling apparatus, in accordance with one or more aspects of the present invention.

FIGS. 7A-7C depict another variation of an immersion-cooling approach, wherein one or more components of an electronic system or subsystem are at least partially immersion-cooled using a passively-circulated working fluid, such as a dielectric fluid. As explained further below, this variation comprises a cooling apparatus which includes a vapor condenser, in accordance with one or more aspects of the present invention.

More specifically, FIG. 7A is a schematic depiction of one embodiment of a coolant-cooled electronics rack, generally denoted 700, employing immersion-cooling of electronic systems (or subsystems) 710, in accordance with one or more aspects of the present invention. In this implementation, the plurality of immersion-cooled electronic systems 710 are illustrated horizontally-disposed within an electronics rack 701 so as to be essentially stacked within the rack. By way of example, each electronic system 710 may be a server unit of a rack-mounted plurality of server units, and include multiple electronic components to be cooled. In one embodiment, each electronic system comprises multiple different types of electronic components 712 to be cooled having different heights and/or shapes.

Referring collectively to FIGS. 7A & 7B, the immersion-cooled electronic systems 710 each comprise (in this example) a housing 740 at least partially surrounding and forming a sealed or fluid-tight compartment about the electronic system, with the plurality of electronic components 712 of the electronic system being disposed within the fluid-tight compartment. In one example, electronic components 712 include one or more processors and one or more dual-in-line memory module (DIMM) arrays. A dielectric fluid 711 is provided within compartment 740, and the plurality of electronic components to be cooled are at least partially immersed within a dielectric fluid 711. A baffle 713 is provided to facilitate maintaining electronic components 712 substantially immersed within the dielectric fluid, and to direct flow of dielectric fluid vapor generated by boiling of the dielectric fluid at one or more surfaces of the electronic components, towards a dielectric fluid vapor outlet 731 (e.g., port and line), disposed in an upper portion of the fluid-tight compartment 740. In one embodiment, baffle 713 includes multiple openings (not shown) which facilitate drainage of any dielectric fluid (in liquid state) above baffle 713 back to the lower portion of the fluid-tight compartment, and passage of dielectric fluid vapor from the lower portion of the compartment to the upper portion of the compartment. As illustrated, the housing 740 further includes a dielectric fluid liquid inlet 721 (e.g., port and line), through which dielectric fluid (in liquid state) is provided to the compartment. Dielectric fluid liquid inlet 721 and dielectric fluid vapor outlet 731 may comprise, in one embodiment, ports and flexible tubes or hoses which couple to the respective rack-level dielectric coolant supply or return manifold 720, 730.

One or more hermetically-sealed electronic connectors 745 are also provided in each fluid-tight housing 740, for example, at a back surface thereof, for docking into a corresponding electrical plane of the electronics rack in order to provide electrical and network connections 746 to the electronic system or subsystem disposed within the housing 740 when the electronic system is operatively positioned within the housing and the housing is operatively positioned within the electronics rack.

In an operational state, dielectric fluid 711 pools in the liquid state at the bottom of the housing 740, and is of sufficient volume to submerge, at least partially, electronic components 712. Electronic components 712 dissipate varying amounts of power, which cause the dielectric fluid to boil, releasing a dielectric fluid vapor, which rises to the upper portion of the sealed compartment of the housing.

As illustrated in FIGS. 7A & 7B, dielectric fluid vapor outlet 731 couples in fluid communication the immersion-cooled electronic systems 710 and dielectric fluid vapor return manifold 730, the dielectric fluid vapor outlets 731 in fluid communication (via a dielectric fluid vapor supply line 732) to a passive vapor-condensing unit 750 disposed in an upper portion of electronics rack 701. In one embodiment, passive vapor-condensing unit 750 comprises a direct contact coolant-to-vapor condenser, as described below, wherein a condensing coolant, such as water from a coolant loop 705, is circulated through the condenser. The direct contact vapor condenser condenses the dielectric fluid vapor from the respective immersion-cooled electronic systems to produce dielectric fluid liquid (or condensate) 711. This dielectric fluid liquid drops to the bottom of vapor-condensing unit 750, which includes a dielectric fluid liquid outlet (or gravity drain line) 722, which directs dielectric fluid liquid to dielectric fluid supply manifold 720 for return (via the dielectric fluid liquid inlets 721) to the immersion-cooled electronic systems 710.

Note that in operation, the dielectric fluid vapor generated by the boiling process inside of the immersion-cooled electronic systems exhausts out the respective dielectric fluid vapor outlets. This movement of dielectric fluid vapor from the immersion-cooled electronic systems is buoyancy-driven and separate from any actively-pumped flow. After entering the vertically-oriented dielectric fluid vapor return manifold, the dielectric fluid vapor travels (in this embodiment) upwards to enter the passive vapor-condensing unit 750. As explained further below, the passive vapor-condensing unit is, in one embodiment, a vapor-to-liquid heat exchanger, wherein the liquid is in direct contact with the vapor. The vapor condenses through direct contact heat transfer to the liquid phase, and drains out the bottom of the vapor condenser, into the dielectric fluid liquid supply manifold that supplies dielectric fluid liquid back to the immersion-cooled electronic systems.

Note that the facility coolant supplied to the direct contact vapor condenser needs to be at a temperature below the saturation temperature of the dielectric fluid. By way of example, if the facility coolant is water, a temperature of about 30° C., or higher, may be employed, based on the saturation temperature of the dielectric fluid within the liquid-cooled electronics rack. Such a relatively high coolant temperature means that minimum cooling power is required to produce the facility coolant at the desired temperature to remove heat from the electronics rack.

In general, fluidic coupling between the electronic systems and the dielectric fluid manifolds and lines, as well as between the manifolds and the passive vapor-condensing unit, and the facility coolant supply and return loop, can be established using suitable hoses, hose barb fittings, and quick disconnect couplers. In one example, the illustrated, vertically-oriented dielectric fluid vapor return and liquid supply manifolds each include ports which facilitate fluid connection of the respective components to the manifolds via flexible hoses. Respective quick connect couplings may be employed to couple flexible dielectric fluid tubes or hoses to the respective dielectric fluid inlet and vapor outlets of the immersion-cooled electronic systems to (for example) allow for removal of a housing and electronic system from the electronics rack. As noted above, the quick connect couplings may be any one of various types of commercially available couplings, such as those available from Colder Products Company, of St. Paul, Minn., USA, or Parker Hannifin, of Cleveland, Ohio USA.

Disclosed hereinbelow with reference to FIGS. 7C-8E are embodiments of a passive, direct contact vapor condenser for a cooling apparatus such as described above in connection with FIGS. 7A & 7B. Generally stated, this vapor condenser includes a condenser housing comprising a condensing chamber accommodating a working fluid (e.g., a dielectric fluid) and a coolant (e.g., an aqueous-based coolant), a working fluid vapor inlet and a working fluid liquid outlet, and a coolant inlet structure and a coolant outlet structure. The working fluid and the coolant are in direct contact within the condensing chamber and are immiscible fluids, and the condensing chamber includes a working fluid vapor layer and a working fluid liquid layer, with a coolant layer disposed therebetween. The working fluid vapor inlet facilitates flow of working fluid vapor into the condensing chamber, and the working fluid liquid outlet facilitates egress of working fluid liquid from the condensing chamber, for instance, for return to one or more immersion-cooled electronic systems such as described above in connection with FIGS. 7A & 7B. The coolant inlet structure facilitates ingress of coolant, such as facility-chilled coolant, into the working fluid vapor layer of the condensing chamber in direct contact with the working fluid vapor to facilitate condensing of the working fluid vapor into the working fluid liquid, and thereby transfer of heat from the working fluid vapor to the coolant. The coolant outlet structure facilitates subsequent egress of the coolant from the condensing chamber of the condenser housing.

In one embodiment, the coolant inlet structure includes a coolant inlet manifold with a plurality of coolant inlet openings distributed within the condensing chamber for distributively introducing the coolant into the working fluid vapor layer within the condensing chamber. In another embodiment, the coolant inlet structure comprises a coolant inlet manifold with a plurality of spray nozzles or a plurality of jet nozzles associated with the coolant inlet manifold and distributed within the condensing chamber for distributively introducing, by way of coolant spray, or coolant jets, the coolant into the working fluid vapor layer.

In one implementation, the coolant outlet structure includes a coolant outlet manifold and a plurality of coolant outlet openings (or ports), with the coolant outlet manifold being disposed, at least partially, within the condensing chamber in the coolant layer of the condensing chamber, between the working fluid vapor layer and the working fluid liquid layer. A coolant-working fluid separation baffle may be disposed, at least partially, over the coolant outlet manifold, as explained further below with reference to FIGS. 8A-8D. The coolant-working fluid separation baffle facilitates directing condensed working fluid through the coolant layer to the working fluid liquid layer of the condensing chamber, and includes a plurality of fluid pass-through openings which are located within the condensing chamber at a height below the coolant outlet manifold. In one embodiment, the plurality of fluid pass-through openings of the coolant-working fluid separation baffle resides within the working fluid liquid layer of the condensing chamber. In the embodiment described, it is assumed that the coolant is less dense than the working fluid liquid, and by way of example, the coolant may be an aqueous-based coolant, and the working fluid may be a dielectric fluid, such as one of the above-referenced fluorocarbon coolants.

As an enhancement, a filtration material may also be associated with the coolant-working fluid separation baffle, and be positioned to facilitate separating the coolant and the working fluid liquid, while allowing removal of the coolant from the condensing chamber through the coolant outlet manifold. In one embodiment, the separation filter may comprise a dielectric-fluid-phobic treated material, such as a treated porous membrane. In operation, the coolant may be drawn by a pressure differential to the coolant outlet manifold to further facilitate passage of the coolant across the filtration material, which may be positioned within the coolant flow paths between the plurality of fluid pass-through openings of the coolant-working fluid separation baffle and the coolant outlet manifold.

Referring to FIG. 7C, one embodiment of a passive, direct contact vapor condenser 750 is depicted, in accordance with one or more aspects of the present invention. Vapor condenser 750 includes a housing 751, such as a fluid-tight enclosure, which comprises a condensing chamber 752 accommodating a working fluid and a coolant. The working fluid and the coolant are immiscible fluids, and the condensing chamber includes a working fluid vapor layer 755, a working fluid liquid layer 756, and a coolant layer 757 disposed between the working fluid vapor layer 755 and working fluid liquid layer 756. A working fluid vapor inlet (e.g., inlet port) 753 and working fluid liquid outlet (e.g., outlet port) 754 are associated with housing 751 of vapor condenser 750 and coupled to the respective working fluid vapor line 732 and working fluid return line 722 of an immersion-cooled electronics rack, such as described above in connection with FIGS. 7A & 7B. The working fluid vapor inlet 753 facilitates flow of working fluid vapor into the condensing chamber 752, and the working fluid liquid outlet 754 facilitates egress of working fluid liquid from the condensing chamber 752, that is, from the working fluid liquid layer 756 within the condensing chamber. A coolant inlet structure 760 and a coolant outlet structure 770 are also provided and respectively reside within the working fluid vapor layer 755 and the coolant layer 757 in the embodiment depicted in FIG. 7C. The coolant inlet structure 760 may comprise a coolant inlet manifold with a plurality of coolant inlet openings 761, which may have associated spray nozzles or jet nozzles to facilitate distributed spray or jetting of coolant 762 into direct contact with dielectric fluid vapor within the dielectric fluid vapor layer 755 of condensing chamber 752. This direct contact facilitates condensing of the working fluid vapor into working fluid liquid drops (or globules) which, due to their higher density, drop downward by the action of gravity, through the coolant layer 757 to the saturated dielectric fluid liquid layer 756 at the bottom of condensing chamber 752. The coolant outlet structure 770 comprises, in one embodiment, a distributed coolant outlet manifold with a plurality of coolant outlet openings 771 through which coolant is drawn from the condensing chamber 752. As depicted in FIG. 7C., the coolant outlet structure resides (in one embodiment) within the coolant layer 757 of the condensing chamber 752. A coolant supply line 764 supplies coolant to the coolant inlet structure 760, and a coolant return line 774 removes coolant from the coolant outlet structure 770 of the condensing chamber.

Note that the vapor condenser of FIG. 7C is a direct coolant contacting vapor condenser that may be employed with a passive, immersion-cooled electronics rack, such as described above in connection with FIGS. 7A & 7B. In this embodiment, dielectric fluid condensate drains by means of gravity to feed dielectric fluid liquid to the various immersion-cooled electronic systems. In the embodiment of FIG. 7C, the dielectric fluid vapor layer 755 is in the upper region of the condensing chamber 752, and is created via supply of dielectric fluid vapor from the immersion-cooled electronic systems through the above-described, rack-level, vertically-oriented dielectric fluid vapor return manifold. The coolant, such as chilled water, may be sprayed into the dielectric fluid vapor layer (or region or space) using a coolant inlet structure that is filled with coolant under pressure from a facility coolant loop and injected into direct contact with the vapor via appropriately-sized and configured jet orifices or spray nozzles distributed within the inlet structure. The resulting heat transfer condenses the dielectric fluid vapor, and the condensate falls to the bottom of the condensing chamber, along with the coolant. The condensate drops to the dielectric fluid liquid layer 756 of the condensing chamber due to its greater density compared with the coolant. From the dielectric fluid liquid layer 756, the condensate drains (via gravity) to supply dielectric fluid liquid to the various immersion-cooled electronic systems within the electronics rack. The coolant layer 757 (e.g., water layer) is formed within the condensing chamber 752 from the coolant injected into the condensing chamber, and is located between the dielectric fluid liquid layer 756 and the dielectric fluid vapor layer 755. The coolant outlet structure draws out the coolant through a plurality of coolant outlet openings 771 for return back to the facility coolant loop for, for example, subsequent discharge of heat at the facility level.

Note that the coolant return line can be arranged out-of-plane (vertical) from the coolant supply tube so that there is less chance of any dielectric fluid liquid being drawn into the coolant return tube. In one embodiment, the plurality of coolant outlet openings 771 are on the top portion of the coolant outlet structure 770 (or manifold), and a baffle is used to direct the falling coolant and dielectric fluid condensate around the coolant outlet structure, as described further below with reference to FIGS. 8A-8E. Note that a dielectric fluid liquid capture tank or reservoir (using gravity to separate the coolant and the dielectric fluid liquid) could also be included in the facility coolant loop to trap any dielectric fluid liquid that has been drawn into the facility coolant loop, and the trapped dielectric fluid liquid could be returned to the condensing chamber via a separate pumped loop (not shown).

Figure 8A:
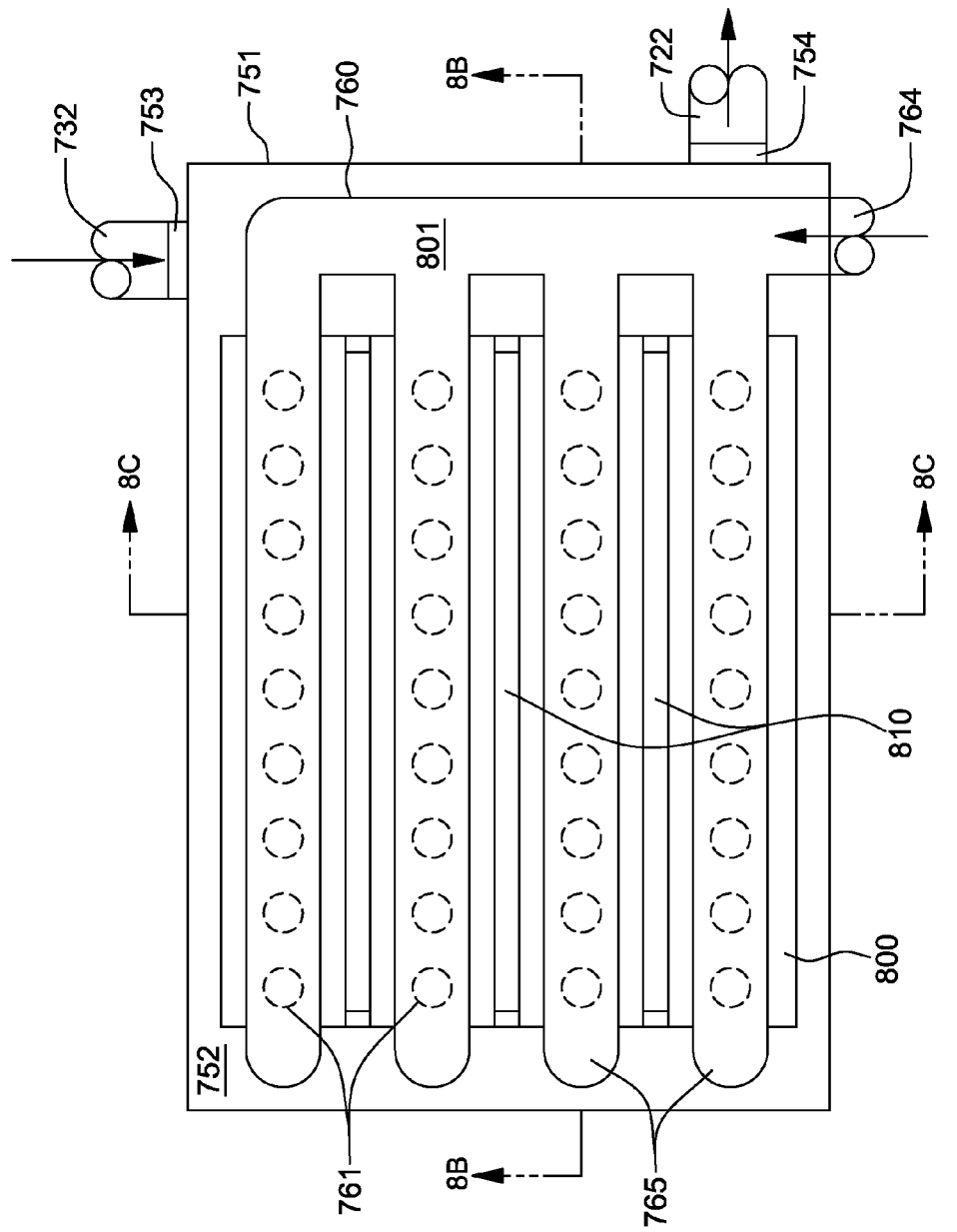
FIG. 8A is a top plan view of another embodiment of a vapor condenser for, for instance, a coolant-cooled electronics rack, in accordance with one or more aspects of the present invention.

FIG. 8A is a top plan view (with top cover removed) of a more detailed embodiment of a vapor condenser 750, in accordance with one or more aspects of the present invention. As illustrated, vapor condenser 750 includes a condenser housing 751 which defines a condensing chamber 752, and includes working fluid vapor inlet 753, and a working fluid liquid outlet 754, respectively coupled to working fluid vapor supply line 732 and working fluid liquid return line 722, as described above. In this embodiment, the coolant inlet structure 760 comprises a coolant inlet manifold with a plurality of arms 765 distributively arrayed within the condensing chamber 752 to facilitate distributed injection of coolant via the plurality of coolant inlet openings 761 into the condensing chamber, and more particularly, into the dielectric fluid vapor layer of the condensing chamber, as described above. The coolant inlet structure 760 receives coolant via a coolant supply line 764.

Depicted in FIG. 8A is a coolant-working fluid separation baffle 800, lying below the coolant inlet structure 760, and over the coolant outlet structure 770 (see FIG. 7C). This coolant-working fluid separation baffle 800 comprises a plurality of fluid pass-through openings 810 which are configured, in this example, as flow-through slots through which the mixed coolant and dielectric fluid condensate drops toward the bottom of the condensing chamber from the dielectric fluid vapor layer. The baffle 800 functions to channel the returning coolant and globules of condensed, immiscible dielectric fluid liquid downwards, through the pass-through openings residing in the lower portion of the baffle plate between, for instance, respective sets of arms 765 of the coolant inlet structure 760, in the illustrated plan view of FIG. 8A. Channeling the returning flow in this manner promotes the coalescing and agglomeration of smaller globules of dielectric fluid liquid condensate (e.g., fluorocarbon liquid condensate) into larger globules, which will not be carried along with the returning coolant into the coolant outlet openings (or ports) of the coolant outlet structure.

Figure 8B:
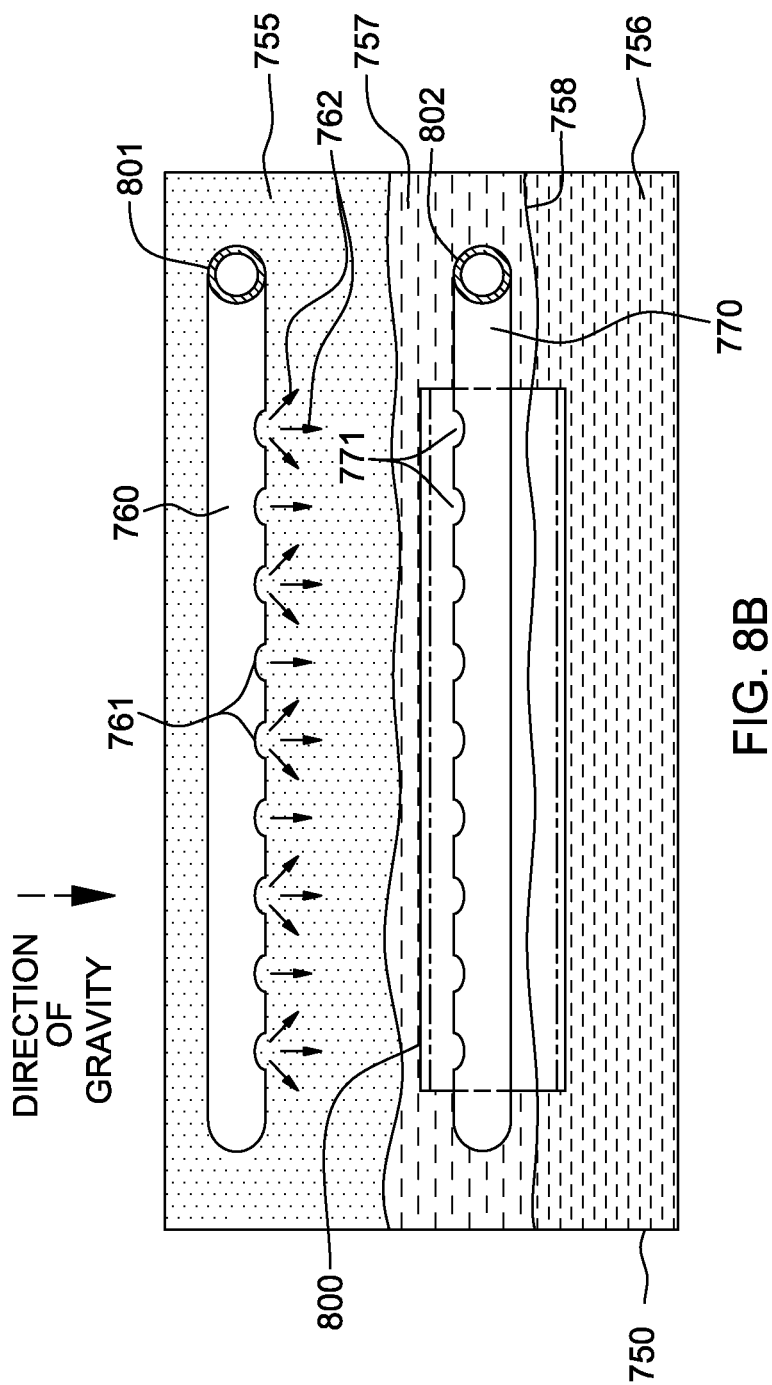
FIG. 8B is a cross-sectional elevational view of the vapor condenser of FIG. 8A, taken along line 8B-8B thereof, in accordance with one or more aspects of the present invention.

FIG. 8B is a first cross-sectional elevational view of the vapor condenser of FIG. 8A. This view illustrates the spraying of coolant 762 into direct contact with dielectric fluid vapor in the dielectric fluid vapor layer 755 or region of the condensing chamber 752. As noted, the coolant 762 may be introduced into the dielectric fluid vapor layer as jets of cooled coolant or as a spray of coolant. When the dielectric fluid vapor (represented by the small dots) comes into contact with the coolant, condensation of the vapor to liquid and transfer of the latent heat of vaporization to the coolant takes place. Depending on the temperature difference between the coolant and the dielectric fluid vapor, there may also be sensible heat transfer, causing the condensed droplets to be subcooled. As noted, the coolant outlet structure 770 is disposed (in one embodiment) within the layer of coolant 757 that resides between the dielectric fluid liquid layer 756 and the dielectric fluid vapor layer 755 within the condensing chamber. This embodiment also illustrates one position for the plurality of coolant inlet openings 761 in the coolant inlet structure 760, that is, facing in a downward direction, and depicts (by way of example) the plurality of coolant outlet openings 771 in an upward-facing portion of the coolant outlet structure 770. The coolant inlet structure or manifold includes a coolant inlet tube or structure 801, which facilitates distributive flow of coolant to the spaced arms 765 of the coolant inlet structure, and the coolant outlet structure or manifold may comprise a similar configuration wherein a plurality of arms 775 (in FIG. 8C) are coupled to a coolant return tube or structure 802 for collection and return of the coolant to, for instance, a facility coolant loop coupled to the vapor condenser. Note in this embodiment, that the coolant-to-dielectric fluid liquid interface 758 resides below the coolant outlet structure 770, and the coolant-working fluid separation baffle 800 resides, at least partially, over the coolant outlet structure, as illustrated in greater detail in FIGS. 8C & 8D.

Figure 8C:
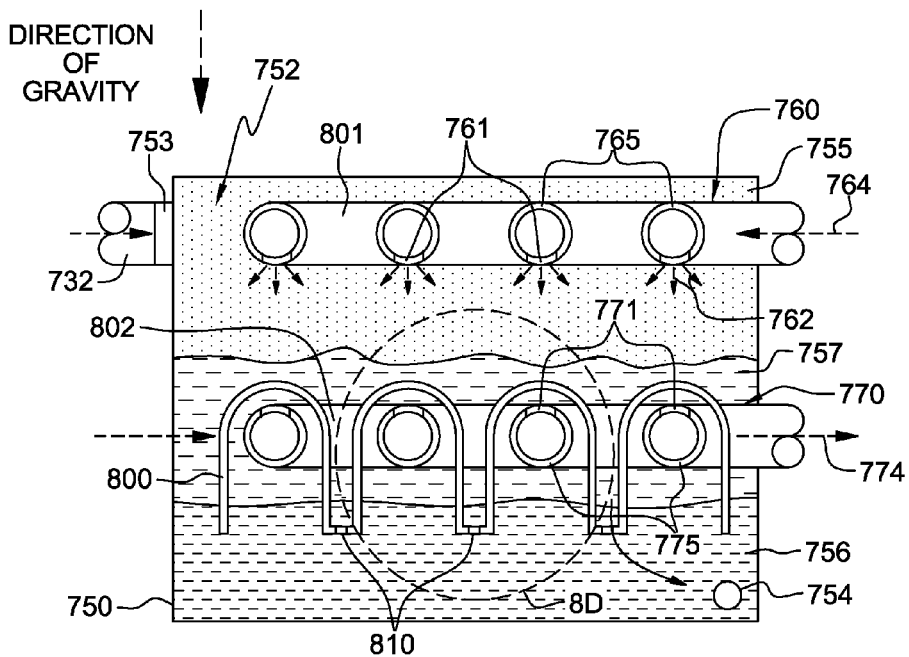
FIG. 8C is a cross-sectional elevational view of the vapor condenser of FIGS. 8A & 8B, taken along line 8C-8C in FIG. 8A, in accordance with one or more aspects of the present invention.
Figure 8D:
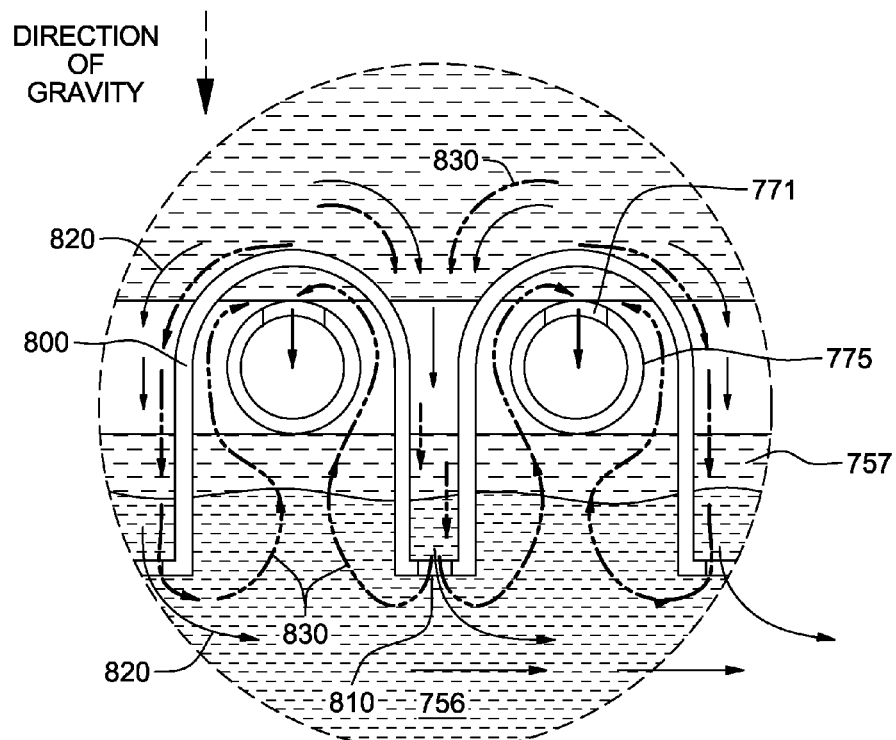
FIG. 8D is a partial enlargement of the vapor condenser of FIGS. 8A-8C, taken along the dashed circle of FIG. 8C, in accordance with one or more aspects of the present invention.

Referring collectively to FIGS. 8C & 8D, dielectric fluid vapor enters via dielectric fluid vapor inlet 753 into condensing chamber 752, and in particular, into the dielectric fluid vapor layer 755 within the condensing chamber. Also illustrated in this figure are multiple coolant supply arms (or tubes) 765 and the multiple coolant return arms (or tubes) 775, projecting out of the plane of the figure, from the coolant inlet tube 801 and the coolant outlet tube 802 of the coolant inlet and outlet structures, respectively. The formed baffle plate 800, which as noted, provides separation between the dielectric fluid liquid and the coolant, and inhibits the ingestion of dielectric fluid liquid into the plurality of coolant outlet openings 771 of the coolant outlet structure 770, is shown surrounding the arms or tubes 775 of the coolant outlet structure. In this representation, the dielectric fluid liquid outlet 754 is depicted in a lower, right portion of the dielectric fluid liquid layer 756 within the condensing chamber.

FIG. 8D is an enlarged depiction of the coolant-working fluid separation baffle 800 surrounding the coolant return arms or tubes 775 which comprise the plurality of coolant outlet openings 771. In this depiction, the solid arrows 820 represent the dielectric fluid liquid condensate component of the dropping mixture, and the dashed arrows 830 represent the coolant component. As illustrated, the mixture of components 820, 830 drop through the fluid pass-through openings 810 in baffle 800 into (in the depicted embodiment) the dielectric fluid liquid layer 756. That is, the plurality of fluid pass-through openings 810 are disposed (in one embodiment) within the working fluid liquid layer 756 of the condensing chamber. Since the coolant is less dense than the working fluid liquid, the coolant component 830 rises from the dielectric fluid liquid layer 756 towards the coolant layer 757, where the coolant is drawn into the coolant outlet openings 771 of the coolant outlet structure 770. In this manner, coolant is separated from the dielectric fluid liquid. Depending on the respective coolant and dielectric fluid flow rates, which will in turn depend on the heat load, the length (or depth) of the downward-projecting portions of baffle 800 may be varied to ensure that the dielectric fluid liquid issuing from the pass-through openings 810 at the bottom of the baffle is not carried with the coolant flowing upwards to the coolant outlet openings.

Figure 8E:
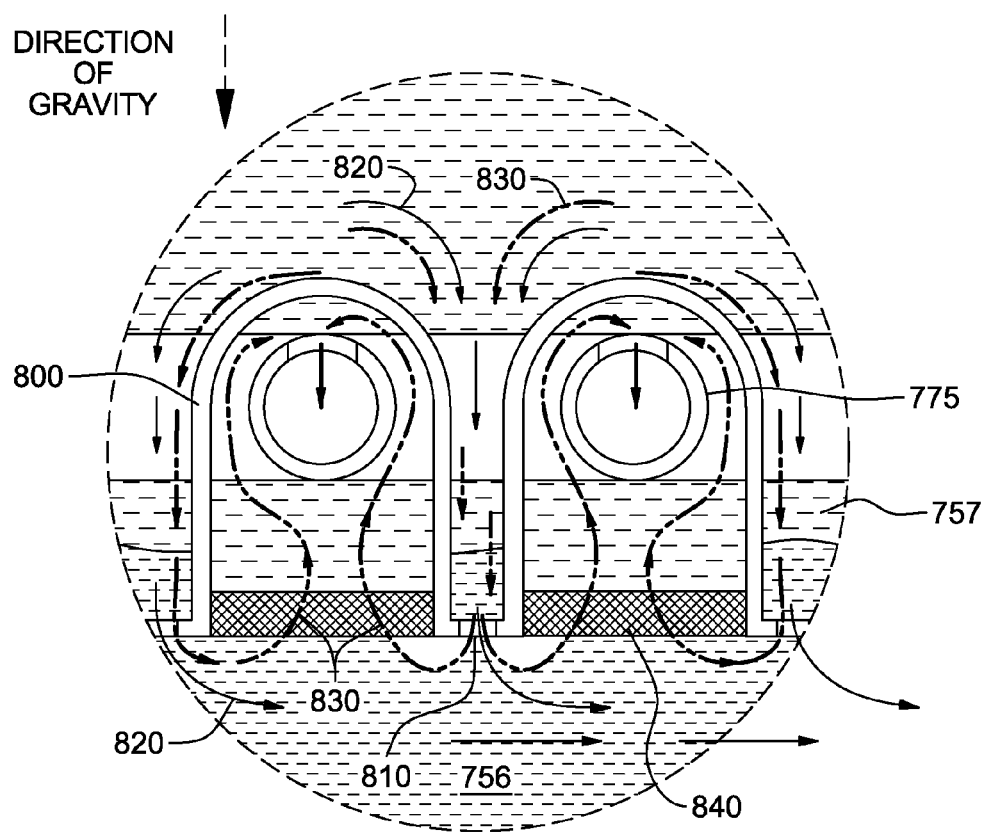
FIG. 8E is an enhanced embodiment of the partially enlarged vapor condenser of FIG. 8D, in accordance with one or more aspects of the present invention.

FIG. 8E illustrates a variation on the vapor condenser of FIGS. 8A-8D, wherein a dielectric-fluid-phobic filtration material 840 is positioned (by way of example) in association with the coolant-working fluid separation baffle 800 to facilitate separation of the coolant component 830 and the dielectric fluid liquid component 820 of the dropping flow, so that only the coolant passes into the coolant outlet structure 770. In one embodiment, the filtration material 840 is a porous membrane comprising a dielectric-fluid-phobic-treated filtration material placed between the coolant return sections of the downward-projecting portion of the baffle 800 structure. The use of this filter material 840 will allow for the length of the downward-projecting portion of the baffle 800 structure to be minimized, while still ensuring separation of the dielectric fluid liquid (e.g., fluorocarbon liquid) from the returning coolant (e.g., water) stream.

Figure 9A:
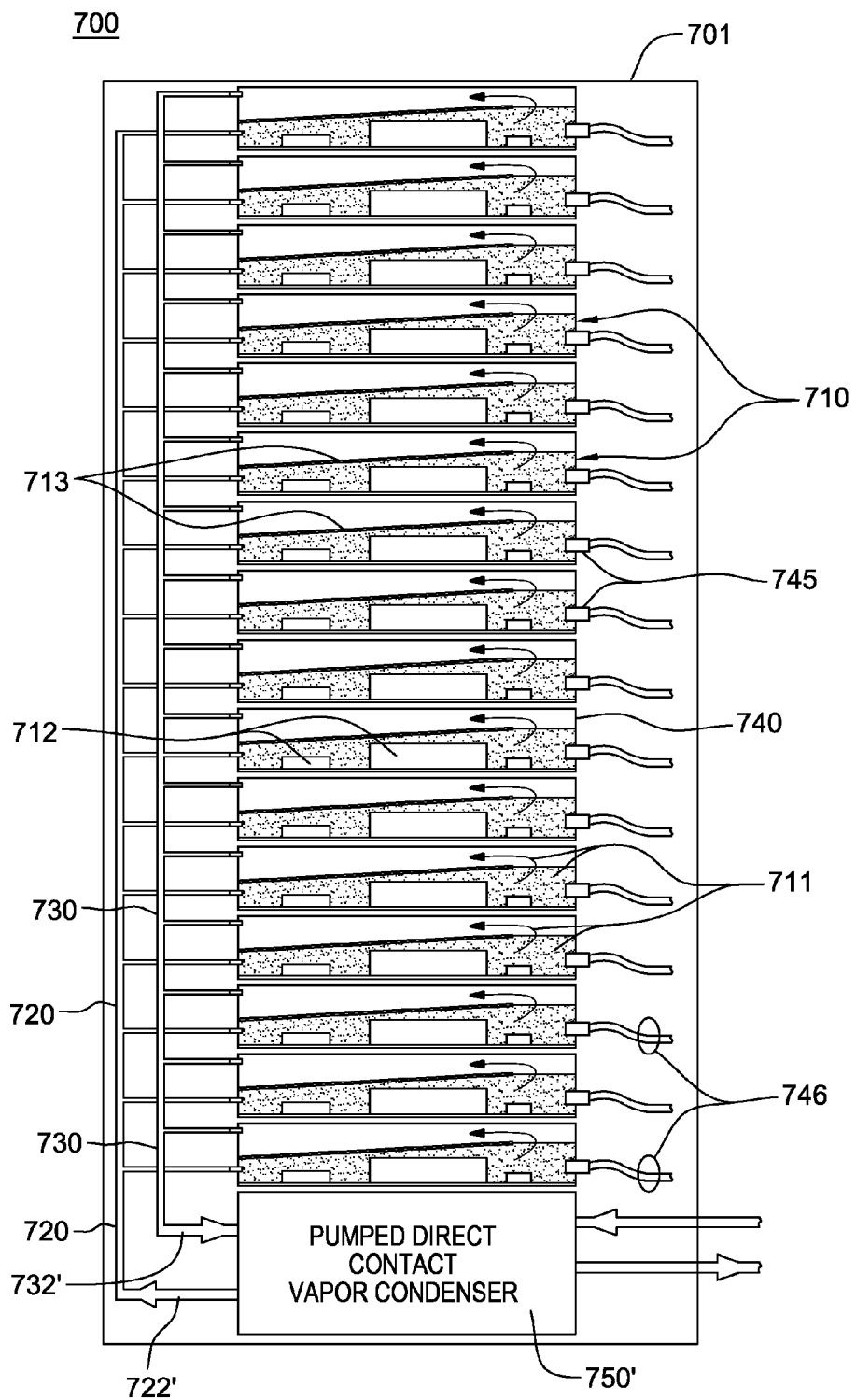
FIG. 9A is an elevational view of a further embodiment of a coolant-cooled electronics rack comprising a cooling apparatus and multiple electronic systems or subsystems at least partially immersion-cooled by a working fluid of the cooling apparatus, in accordance with one or more aspects of the present invention.
Figure 9B:
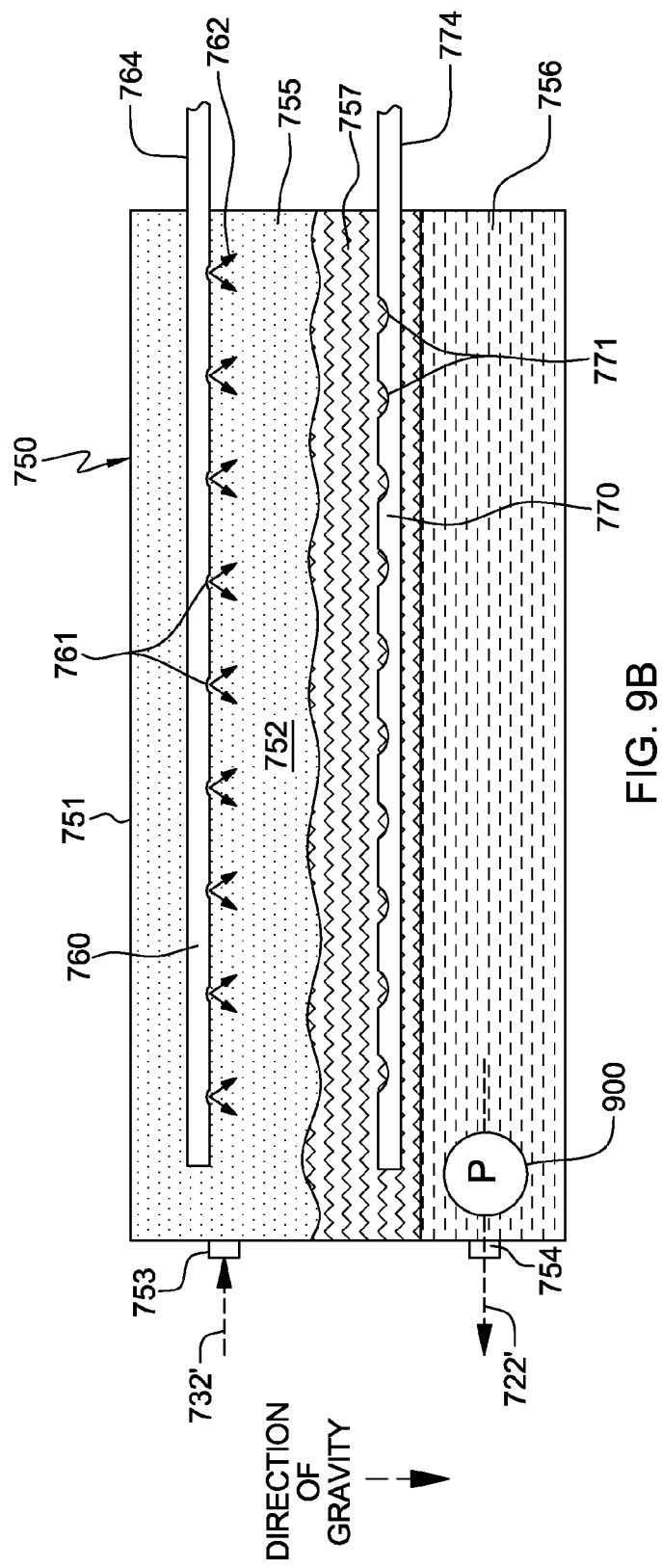
FIG. 9B is a cross-sectional elevational view of one embodiment of a vapor condenser for, for instance, the coolant-cooled electronic system of FIG. 9A, in accordance with one or more aspects of the present invention.

FIGS. 9A & 9B depict an alternate embodiment of the immersion-cooled electronics rack of FIGS. 7A-8E. This alternate embodiment is substantially identical to the embodiment described above in connection with FIGS. 7A-7C, except that the direct contact vapor condenser 750' is disposed at the bottom of the electronics rack 701, in the example of FIGS. 9A & 9B.

Referring collectively to FIGS. 9A & 9B, there are three principal differences between the embodiment depicted and that described above in connection with FIGS. 7A-8E. In the embodiment of FIGS. 9A & 9B, the direct contact vapor condenser 750' is disposed in a bottom portion of the electronics rack 701, and there is a submerged pump in the dielectric fluid liquid layer of the vapor condenser to allow for pumped dielectric fluid liquid supply to the immersion-cooled electronic systems 710. Additionally, in this embodiment, there is a two-phase dielectric fluid mixture which enters the vapor condenser, with the vapor separating into the dielectric fluid vapor layer within the condensing chamber and the dielectric liquid fluid draining to the dielectric fluid liquid layer at the bottom portion of the condensing chamber. Otherwise, the vapor condenser of FIG. 9B is substantially identical to that described above in connection with FIGS. 7C & 8A-8E. In operation, the dielectric fluid vapor condenses through direct contact heat transfer with the coolant into dielectric fluid liquid phase, and is drained out from the vapor condenser using the submerged pump 900, into the dielectric fluid liquid supply manifold 720 that supplies the immersion-cooled electronic systems 710 with dielectric fluid liquid coolant.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
    a vapor condenser, the vapor condenser comprising:
        a condenser housing comprising a condensing chamber accommodating a working fluid and a coolant, the working fluid and the coolant being in direct contact within the condensing chamber and being immiscible fluids, and the condensing chamber comprising a working fluid vapor layer and a working fluid liquid layer;
        a working fluid vapor inlet and a working fluid liquid outlet, the working fluid vapor inlet facilitating flow of working fluid vapor into the condensing chamber, and the working fluid liquid outlet facilitating egress of working fluid liquid from the condensing chamber;
        a coolant inlet structure and a coolant outlet structure, the coolant inlet structure facilitating ingress of the coolant into the working fluid vapor layer of the condensing chamber in direct contact with the working fluid vapor to facilitate condensing of the working fluid vapor into the working fluid liquid and thereby transfer heat from the working fluid vapor to the coolant, and the coolant outlet structure facilitating subsequent egress of the coolant from the condensing chamber of the condenser housing; and
        wherein the coolant outlet structure comprises a coolant outlet manifold with a plurality of coolant outlet openings, the coolant outlet manifold being disposed, at least partially, within the condensing chamber in a coolant layer within the condensing chamber, between the working fluid vapor layer and the working fluid liquid layer.

2. The cooling apparatus of claim 1, wherein the coolant inlet structure comprises a coolant inlet manifold with a plurality of coolant inlet openings distributed within the condensing chamber and introducing, the coolant into the working fluid vapor layer within the condensing chamber of the condenser housing.

3. The cooling apparatus of claim 1, wherein the coolant inlet, structure comprises a coolant inlet manifold with ,a plurality of spray nozzles or a plurality of jet nozzles associated therewith and distributed within the condensing chamber for introducing the coolant into the working fluid vapor layer of the condensing chamber.

4. The cooling apparatus of claim 1, further comprising a coolant-working fluid separation baffle disposed, at least partially, over the coolant outlet manifold, the coolant-working fluid separation baffle facilitating directing condensed working fluid liquid drops through the coolant layer to the working fluid liquid layer of the condensing chamber.

5. The cooling apparatus of claim 4, wherein the coolant-working fluid separation baffle comprises a plurality of fluid pass-through openings, the plurality of fluid pass-through openings being located in the condensing chamber at a height below the coolant outlet manifold.

6. The cooling apparatus of claim 5, wherein the plurality of fluid pass-through openings of the coolant-working fluid separation baffle reside within the working fluid liquid layer of the condensing chamber, and the coolant is less dense than the working fluid liquid.

7. The cooling apparatus of claim 5, wherein the coolant comprises an aqueous-based coolant, and the working fluid comprises a dielectric fluid.

8. The cooling apparatus of claim 7, further comprising a dielectric-fluid-phobic filtration material positioned to facilitate separating the coolant and the working fluid liquid, while allowing removal of the coolant from the condensing chamber through the coolant outlet manifold.

9. The cooling apparatus of claim 8, wherein the plurality of liquid pass-through openings in the coolant-working fluid separation baffle are within the working fluid liquid layer of the condensing chamber, and the dielectric-fluid-phobic filtration material is disposed in at least one coolant flow path between the plurality of fluid pass-through openings and the coolant outlet manifold.

10. A coolant-cooled electronic system comprising:
    an electronic system cooled, at least in part, by a working fluid boiling within an electronic system housing and
    a cooling apparatus comprising a vapor condenser in fluid communication with the electronic system housing to facilitate transfer of the working fluid therebetween, the vapor condenser comprising;
        a condenser housing comprising a condensing chamber accommodating the working fluid and a coolant, the working fluid and the coolant being in direct contact within the condensing chamber and being immiscible fluids, and the condensing chamber comprising a working fluid vapor layer and a working fluid liquid layer;
        a working fluid vapor inlet and a working fluid liquid outlet, the working fluid vapor inlet facilitating flow of working fluid vapor into the condensing chamber from the electronic system housing, and the working fluid liquid outlet facilitating egress of working fluid liquid from the condensing chamber for return to the electronic system housing;
        a coolant inlet structure and a coolant outlet structure, the coolant inlet structure facilitating ingress of the coolant into a working fluid layer region of the condensing chamber in direct contact with the working fluid vapor to facilitate condensing of the working fluid vapor into the working fluid liquid and thereby transfer of heat from the working fluid vapor to the coolant, and the coolant outlet structure facilitating subsequent egress of coolant from the condensing chamber of the condenser housing; and
        wherein the coolant outlet structure is disposed. at least partially, within the condensing chamber in a coolant layer within the condensing chamber, between the working fluid vapor layer and the working fluid liquid layer.

11. The coolant-cooled electronic system of claim 10, wherein the coolant inlet structure comprises a coolant inlet manifold with a plurality of spray or jet nozzles distributively introducing the coolant into the working fluid vapor layer of the condensing chamber.

12. The coolant-cooled electronic system of claim 10, further comprising a coolant-working fluid separation baffle disposed, at least partially, over the coolant outlet structure, the coolant-working fluid separation baffle facilitating directing condensed working fluid liquid drops through the coolant layer to the working fluid liquid layer of the condensing chamber.

13. The coolant-cooled electronic system of claim 12, wherein the coolant-working fluid separation baffle comprises a plurality of fluid pass-through openings, the plurality of fluid pass-through openings being located in the condensing chamber at a height below the coolant outlet structure.

14. The coolant-cooled electronic system of claim 13, wherein the plurality of fluid pass-through openings of the coolant-working fluid separation baffle reside within the working fluid liquid layer of the condensing chamber, and the coolant is less dense than the working fluid liquid.

15. The coolant-cooled electronic system of claim 13, wherein the coolant comprises an aqueous-based coolant, and the working fluid comprises a dielectic fluid, and wherein the vapor condenser further comprises a dielectric-fluid-phobic filtration material positioned within the condensing chamber to facilitate separating the coolant and the working fluid liquid, while allowing removal of the coolant from the condensing chamber through the coolant outlet structure.

16. The coolant-cooled electronic system of claim 10, wherein the electronic system comprises an immersion-cooled electronic system with a plurality of electronic components at least partially immersion-cooled within the electronic system housing via a dielectric fluid liquid.

17. A method comprising:
  providing a vapor condenser, wherein providing the vapor condenser comprises:
  providing a condenser housing comprising a condensing chamber accommodating a working fluid and a coolant, the working fluid and the coolant being in direct contact within the condensing chamber and being immiscible fluids, and the condensing chamber comprising a working fluid vapor layer and a working fluid liquid layer;
  providing a working fluid vapor inlet and a working fluid liquid outlet, the working fluid vapor inlet facilitating flow of working fluid vapor into the condensing, chamber, and the working fluid liquid outlet facilitating egress of working fluid liquid from the condensing chamber;
  providing a coolant inlet structure and a coolant outlet structure, the coolant inlet structure facilitating ingress of coolant into the working fluid vapor layer of the condensing chamber in direct contact with the working fluid vapor to facilitate condensing of the working fluid vapor into the working fluid liquid and thereby transfer of heat from the working fluid vapor to the coolant, and the coolant outlet structure facilitating subsequent egress of the coolant from the condensing chamber of the condenser housing; and
  wherein providing the coolant outlet structure comprising disposing the coolant outlet structure, at least partially, within the condensing chamber in a coolant layer within the condensing chamber between the working fluid vapor layer and the working fluid liquid layer, and providing a coolant-working fluid separation baffle disposed, at least partially, over the coolant outlet structure, the coolant-working fluid separation baffle comprising a plurality of fluid pass through openings located in the condensing chamber at a height below the coolant outlet structure and within the working fluid liquid layer of the condensing chamber.

* * * * *